United States Patent
Su et al.

(10) Patent No.: US 7,693,503 B2
(45) Date of Patent: Apr. 6, 2010

(54) MIXER HAVING FILTERING MODULE TO FILTER OUT LOW-FREQUENCY COMPONENTS TO MINIMIZE NOISE

(75) Inventors: Jiong-Guang Su, Keelung (TW); Shyh-Chyi Wong, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 519 days.

(21) Appl. No.: 11/768,901

(22) Filed: Jun. 26, 2007

(65) Prior Publication Data
US 2008/0160949 A1 Jul. 3, 2008

(30) Foreign Application Priority Data
Dec. 29, 2006 (TW) .............................. 95149867 A

(51) Int. Cl.
*H04B 1/26* (2006.01)
*H04B 1/28* (2006.01)

(52) U.S. Cl. ..................... 455/323; 455/326; 455/333

(58) Field of Classification Search ................ 455/318, 455/323, 326, 292, 293, 333, 209, 130, 189.1, 455/190.1; 327/113, 115, 117, 118; 330/250, 330/252

See application file for complete search history.

(56) References Cited

U.S. PATENT DOCUMENTS

| | | | | |
|---|---|---|---|---|
| 6,157,822 A | * | 12/2000 | Bastani et al. | 455/323 |
| 7,110,740 B2 | * | 9/2006 | Miyashita | 455/326 |
| 7,146,150 B2 | * | 12/2006 | Monge | 455/323 |
| 7,319,851 B2 | * | 1/2008 | Klumperink et al. | 455/323 |
| 7,356,317 B2 | * | 4/2008 | Xu et al. | 455/130 |

* cited by examiner

*Primary Examiner*—Sonny Trinh
(74) *Attorney, Agent, or Firm*—Winston Hsu

(57) ABSTRACT

A mixer for down-converting an input signal to an output signal is disclosed. The mixer includes an amplifying circuit and a down-converting circuit. The amplifying circuit is utilized for amplifying the input signal to generate an amplified signal. The down-converting circuit includes a filtering module, a loading module, and a down-converting module. The filtering module is coupled to the amplifying circuit, and is utilized for filtering low-frequency components in the amplified signal. The loading module is coupled to the amplifying circuit and a predetermined voltage level, and is utilized for providing a DC bias voltage to the amplifying circuit. The down-converting module is coupled to the filtering module and the predetermined voltage level, and is utilized for generating the output signal according to a local oscillating signal.

13 Claims, 5 Drawing Sheets

MIXER HAVING FILTERING MODULE TO FILTER OUT LOW-FREQUENCY COMPONENTS TO MINIMIZE NOISE

BACKGROUND OF THE INVENTION

1. Field of the Invention

The present invention relates to a mixer, and more particularly, to a mixer for down-converting a radio frequency (RF) input signal into a low intermediate frequency (low-IF) output signal or a zero intermediate frequency (zero-IF) output signal.

2. Description of the Prior Art

Mixers in conventional signal receiving systems can be implemented by using at least one Gilbert cell. Please refer to FIG. 1A. FIG. 1A is a diagram of a conventional mixer 100 implemented by using a single Gilbert cell. As shown in FIG. 1A, the mixer 100 comprises an amplifying circuit 105 and a down-converting circuit 110. The amplifying circuit 105 includes a transistor $Q_1$, which functions as a transconductance stage in the mixer 100, for amplifying an RF input signal $S_{in}$ to generate an amplified signal $S_{in}'$. The down-converting circuit 110 includes a plurality of resistors $R_1$, $R_2$ and a plurality of transistors $Q_2$, $Q_3$. A switching stage in the mixer 100 is formed by the transistors $Q_2$, $Q_3$ and a loading stage in the mixer 100 is made up of the resistors $R_1$, $R_2$. The down-converting circuit 110 is also a differential circuit for generating an output signal $S_{out}$ according to a local oscillating signal $S_{LO}$. This output signal $S_{out}$ can be a low-IF output signal or a zero-IF output signal. Additionally, the amplifying circuit 105 is also used as a low noise amplifier (LNA) and coupled to the down-converting circuit 110. Some problems may arise, however, when performing a down-converting operation by using the mixer 100 to generate the output signal $S_{out}$.

First of all, an input impedance of an antenna is often 50 Ohms or 75 Ohms, but the impedance of the mixer 100 as seen from the gate of the transistor $Q_1$ (i.e. the input impedance of the mixer 100) is usually far higher than that of the antenna. For instance, the input impedance of the mixer 100 could be even higher than 1000 Ohms. Thus, it is necessary to add an impedance matching circuit between the antenna and the mixer 100 for solving the impedance mismatch problem when using the mixer 100 to perform down-converting operations. However, the total circuit area will be significantly increased due to this impedance matching circuit. Even though the configuration (i.e. a common-source configuration) of the transistor $Q_1$ in the amplifying circuit 105 may be changed into a common-gate configuration in another example, the total circuit area is still increased due to this required impedance matching circuit.

Secondly, according to mixer theory, the low-frequency noise in the output signal $S_{out}$ depends on DC currents passing through the transistors $Q_2$ and $Q_3$ in the down-converting circuit 110. In addition to performing the down-converting operation on the amplified signal $S_{in}'$ to generate the output signal $S_{out}$, the down-converting circuit 110 is further utilized for providing a DC current to the amplifying circuit 105. The noise figure of the mixer 100 will therefore be higher. In particular, when the above-mentioned transistors are implemented by using complementary metal-oxide-semiconductor field-effect transistors (CMOSFETs), the noise figure becomes much higher due to the flicker noise from the CMOSFETs.

As mentioned above, the conventional mixer can also be implemented by using a pair or a plurality of Gilbert cells. A mixer composed of a pair of Gilbert cells is referred as to a double balance mixer. Please refer to FIG. 1B. FIG. 1B is a diagram of a conventional double balance mixer 115. As shown in FIG. 1B, the mixer 115 includes an amplifying circuit 120, a down-converting circuit 125, and a switching circuit 130. The mixer 115 is utilized for performing the down-converting operation on an RF input signal $S_{in}$ to generate differential output signals $S_{out+}$ and $S_{out-}$ according to local oscillating signals $S_{LO+}$ and $S_{LO-}$, where the voltage levels $V_{bias}$ and $V_{bias}'$ shown in FIG. 1B are used for biasing. The switching circuit 130 is utilized for extracting a DC current from the Voltage Source $V_{CC}$ and providing the amplifying circuit 120 with the extracted DC current, to reduce the problem caused by the higher noise figure. Although the design of the switching circuit 130 can reduce DC currents passing through the down-converting circuit 125, there may still exist a few DC currents passing through the transistors in the down-converting circuit 125. With respect to the mixer 115, the DC currents passing through the transistors in the down-converting circuit 125 are smaller than those in the down-converting circuit 110 of the mixer 100; however, the existence of such DC currents means that the noise figure of the mixer 115 is still very high.

As well as active mixers, the conventional mixer can also be implemented by utilizing a passive mixer. Please refer to FIG. 1C. FIG. 1C is a diagram of a conventional passive mixer 135. As shown in FIG. 1C, the mixer 135 performs the down-converting operation on RF input signals $S_{in+}$ and $S_{in-}$ to generate output signals $S_{out+}$ and $S_{out-}$ according to local oscillating signals $S_{LO+}$ and $S_{LO-}$. Since no DC current passes through transistors $Q_1$, $Q_2$, $Q_3$, and $Q_4$ of a switching stage in the mixer 135 (i.e. no large electric field exists between the drains and sources of the transistors $Q_1$~$Q_4$ almost), the noise figure of the mixer 135 can be lower than that of the active mixer. However, the ability of the mixer 135 to amplify signals is much worse than that of the active mixer. Additionally, output ends of the switching stage in the mixer 135 are usually connected to input ends of the next stage circuit after performing the down-converting operation, and the impedance at the input ends of the next stage circuit often comprises a high real part when the mixer 135 operates at a very low frequency. The impedance seen at the input ends of the mixer 135 therefore becomes much higher. Thus, a serious impedance mismatch problem arises, which leads to considerable signal degradation if the impedance at input ends of the mixer 135 as seen from output ends of a previous stage circuit (compared with the mixer 135) is much higher. Even though the problem resulting from a higher noise figure of the active mixer can be solved by using the passive mixer to replace the active mixer, the impedance mismatch problem and considerable signal degradation can never be solved. Moreover, an impedance matching circuit between the antenna and the input end of the passive mixer is always required

SUMMARY OF THE INVENTION

It is therefore one of the objectives of the present invention to provide a mixer for using a switch-capacitor circuit to filter out DC and low-frequency components in an amplified signal outputted from an amplifying circuit. The mixer allows a down-converting circuit to receive only components excluding the DC and low-frequency components in the amplified signal to perform the down-converting operation, for achieving a higher gain and a lower noise figure. Also, in embodiments of the present invention, a result that an additional impedance matching circuit between an antenna and the input end of the mixer is not required can be achieved by connecting the gate and base of a transistor at the input end of the amplifying stage in the mixer.

According to an embodiment of the present invention, a mixer for down-converting an input signal into an output signal is disclosed. The mixer comprises an amplifying circuit and a down-converting circuit. The amplifying circuit is utilized for amplifying the input signal to generate an amplified signal. The down-converting circuit includes a filtering module, a loading module, and a down-converting module. The filtering module is coupled to the amplifying circuit and utilized for filtering out low-frequency components in the amplified signal. The loading module is coupled to the amplifying circuit and a predetermined voltage level, and is utilized for providing a DC bias voltage to the amplifying circuit. The down-converting module is coupled to the filtering module and the predetermined voltage level, and is utilized for generating the output signal according to a local oscillating signal.

According to another embodiment of the present invention, a mixer for down-converting an input signal into an output signal is disclosed. The mixer comprises a transistor and a down-converting circuit. A control end of the transistor is coupled to the input signal and a base of the transistor. A first end of the transistor is coupled to a predetermined voltage level. The transistor is utilized for amplifying the input signal to generate an amplified signal. The down-converting circuit is coupled to a second end of the transistor and another predetermined voltage level, and is utilized for down-converting the amplified signal to generate the output signal according a local oscillating signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
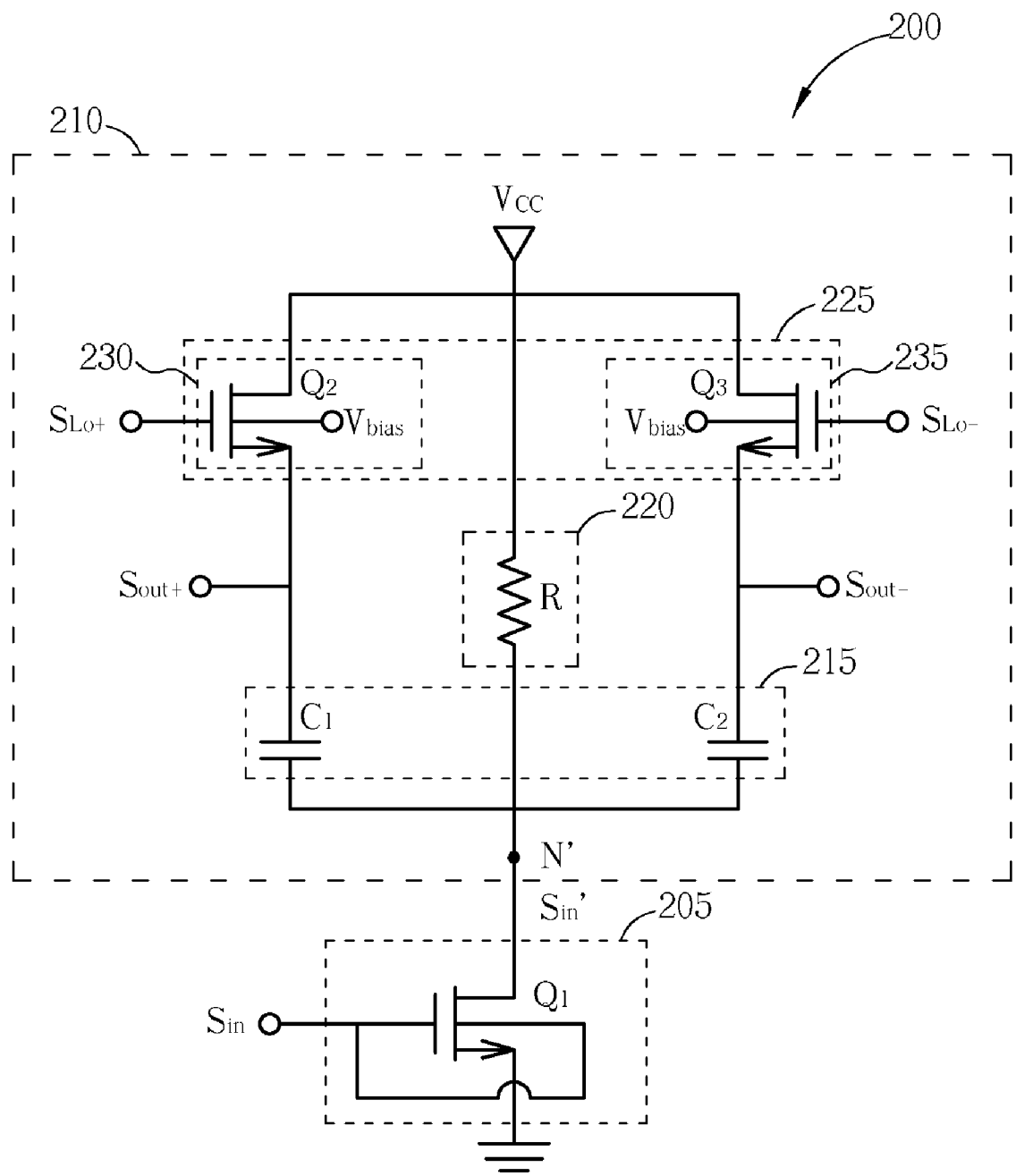
FIG. 2 is a diagram of a mixer according to an embodiment of the present invention.

Please refer to FIG. 2. FIG. 2 is a diagram of a mixer 200 according to an embodiment of the present invention. As shown in FIG. 2, the mixer 200 comprises an amplifying circuit 205 and a down-converting circuit 210. The amplifying circuit 205, including a transistor $Q_1$, is utilized for amplifying an input signal $S_{in}$ to generate an amplified signal $S_{in}'$. The down-converting circuit 210 includes a filtering module 215, a loading module 220, and a down-converting module 225. The filtering module 215 comprises a first capacitor $C_1$ and a second capacitor $C_2$. The first capacitor $C_1$ is utilized for filtering out low-frequency components (e.g. DC components) in the amplified signal $S_{in}'$ to generate a first filtered signal, and the second capacitor $C_2$ is also used for filtering out low-frequency and DC components in the amplified signal $S_{in}'$ to generate a second filtered signal. In other words, only the other components except for the low-frequency components and DC components in the amplified signal $S_{in}'$ can pass through the filtering module 215. Additionally, the loading module 220, including a resistor R, is utilized for providing the amplifying circuit 205 with a DC bias voltage. In this embodiment, the loading module 220 is implemented by using a passive element (i.e. the resistor R). This is because the passive element has low flicker noise but an active element suffers from high flicker noise. However, in another embodiment, the loading module 220 can also be implemented by using the active element. Both of these embodiments fall within the scope of the present invention.

The down-converting module 225 includes a first mixing unit 230 and a second mixing unit 235. The first mixing unit 230 down-converts the first filtered signal to generate a first output signal $S_{out+}$ according to a first oscillating signal $S_{LO+}$, and the second mixing unit 235 down-converts the second filtered signal to generate a second output signal $S_{out-}$ according to a second oscillating signal $S_{LO-}$. Please note that the first oscillating signal $S_{LO+}$ and second oscillating signal $S_{LO-}$ are a differential signal pair corresponding to a local oscillating signal, and the first output signal $S_{out+}$ and second output signal $S_{out-}$ are another differential signal pair. In this embodiment, the first mixing unit 230 is implemented by using a transistor $Q_2$, and the second mixing unit 235 is implemented by using a transistor $Q_3$. The down-converting module 225 controls status of the transistors $Q_2$ and $Q_3$ respectively by utilizing the first oscillating signal $S_{LO+}$ and second oscillating signal $S_{LO-}$ to accomplish the down-converting operation and then outputs the first output signal $S_{out+}$ and second output signal $S_{out-}$ as desired. A combination of the transistors $Q_2$, $Q_3$ and the capacitors $C_1$, $C_2$ is also referred as to a switch capacitor circuit.

Figure 1A:
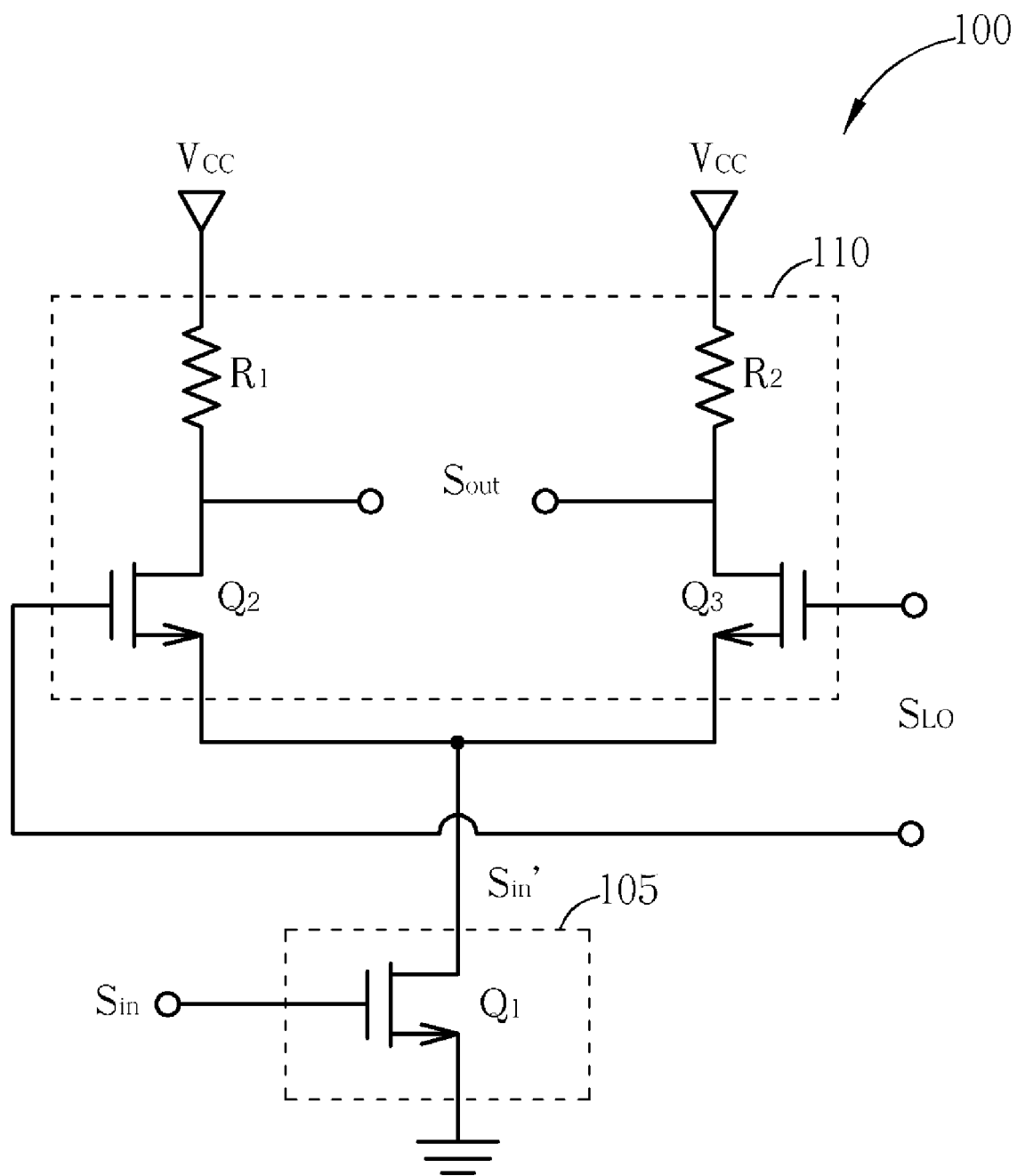
FIG. 1A is a diagram of a conventional mixer implemented by using a single Gilbert cell.
Figure 1B:
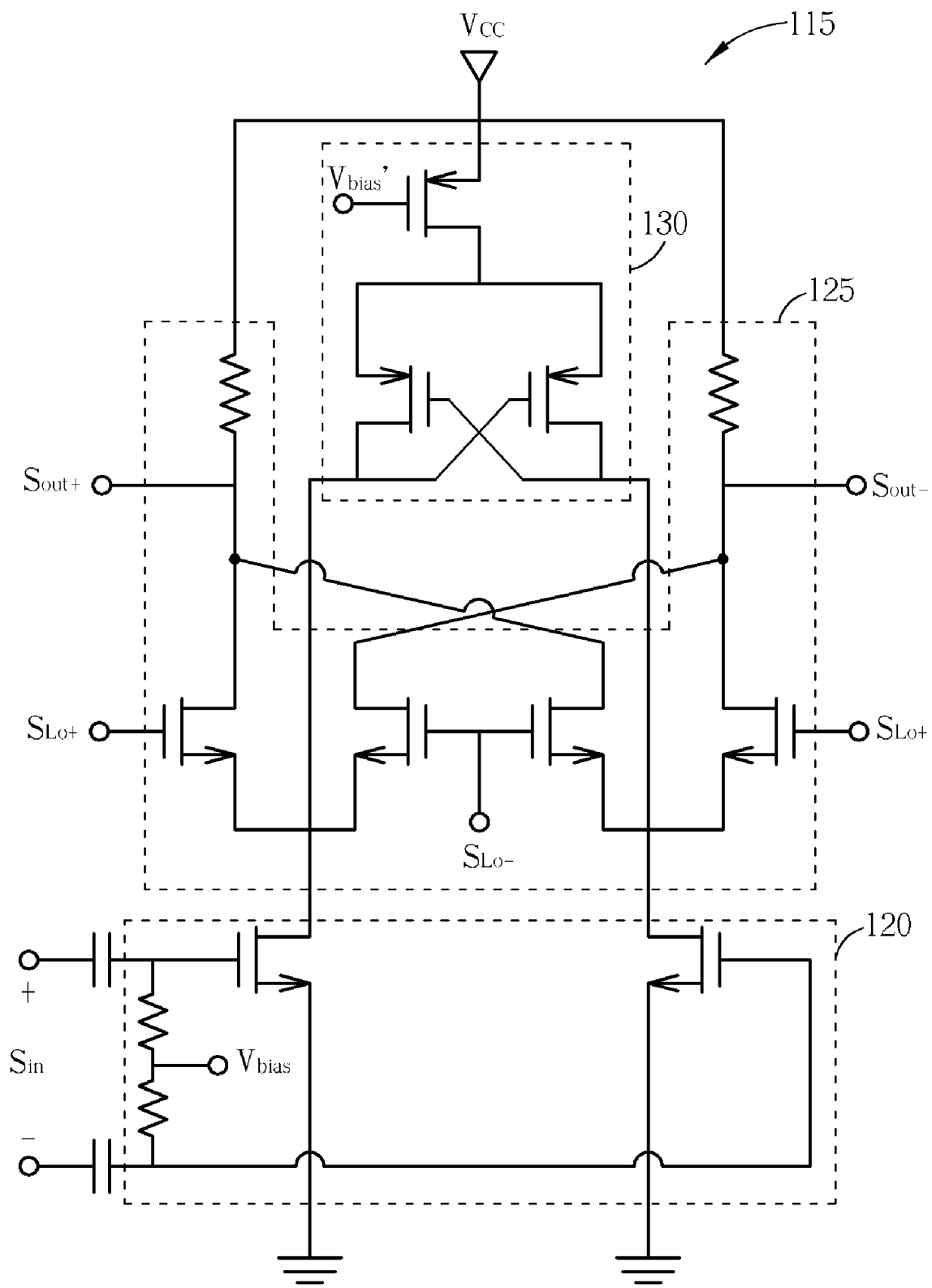
FIG. 1B is a diagram of a conventional double balance mixer.
Figure 1C:
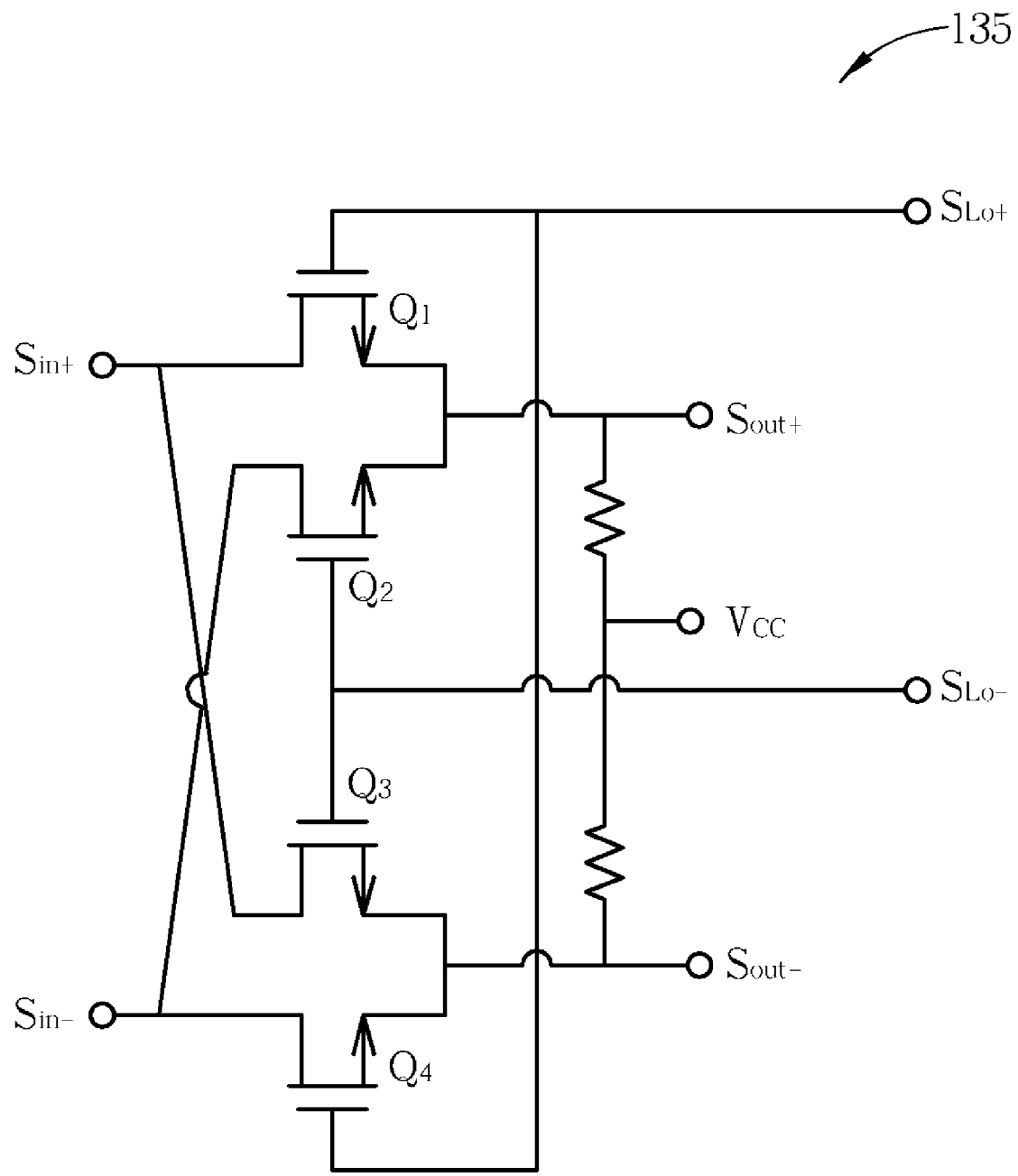
FIG. 1C is a diagram of a conventional passive mixer.

In this embodiment, the gate and base of the transistor $Q_1$ are connected so as to reduce the input impedance at the mixer 200 as seen from the input signal $S_{in}$. In practice, under this connection, when the transistor $Q_1$ operates within an RF frequency range from several hundred KHz to several thousand KHz, an optimal resistance at the minimum noise figure can be closer to 50 Ohms than under the conventional configuration. This conventional configuration here pertains to a configuration separating the gate and base of a transistor without connecting. Moreover, the threshold voltage of the transistor $Q_1$ shown in FIG. 2 is also smaller than that of the transistor $Q_1$ shown in FIG. 1. Thus, the transistor $Q_1$ shown in FIG. 2 continues to operate in the saturation region more easily than the transistor $Q_1$ shown in FIG. 1. Greater stability is achieved when applying the transistor $Q_1$ shown in FIG. 2 as an amplifying circuit, and there is also less possibility for the transistor $Q_1$ to transit between the triode region and saturation region. According to these advantages, the mixer 200 provided by the present invention can therefore be directly connected to the antenna without adding an impedance matching circuit and an LNA between the antenna and the amplifying circuit 205. Even though the impedance matching circuit may be required under some design requirements, the circuit area increased by the added impedance matching circuit is far smaller than that in the prior art.

Only the components excluding the low-frequency components and DC components in the amplified signal $S_{in}'$ can pass through the first capacitor $C_1$ and second capacitor $C_2$ in the filtering module 215; the filtering module 220, connected to the first mixing unit 230 and second mixing unit 235 in parallel, provides the amplifying circuit 205 with a DC bias voltage. The flicker noise in the first output signal $S_{out+}$ and second output signal $S_{out-}$ depends on the DC currents passing through the transistors $Q_2$ and $Q_3$ in the down-converting module 225. Therefore, almost no DC current passes through the down-converting module 225, and the total noise figure of the mixer 200 is decreased greatly so that the problems inherent in the prior art can be solved.

Furthermore, in this embodiment, the impedance at the amplifying circuit 205 as seen from the node N' matches the impedance at the down-converting circuit 210 as seen from the node N' more adequately than in the above-mentioned passive mixer. This is because the impedance at the down-converting circuit 210 as seen from the node N' is equal to that of the transistor $Q_2$, the capacitor $C_1$ connected in series and connected to the loading module 220 in parallel, or that of the transistor $Q_3$, the capacitor $C_2$ connected in series and connected to the loading module 220 in parallel. A choice between the transistor $Q_2$ and capacitor $C_1$ connected in series or the transistor $Q_3$ and capacitor $C_2$ connected in series then connected to the loading module 220 in parallel depends on status of the transistors $Q_2$ and $Q_3$; only one transistor (either $Q_2$ or $Q_3$) is conducted in each timing. Even if the impedance of the resistor R in the loading module 220 and input impedance of the next stage circuit connected to the mixer 200 are both very high, the input impedance at the down-converting circuit 210 as seen from the node N' is still closer to the impedance at the amplifying circuit 205 as seen from the node N' since the resistor R is connected to the transistor ($Q_2$ or $Q_3$) in parallel. Consequently, the power loss caused by originally high impedance mismatch can be reduced.

The concept of the present invention can also be applied into other non-differential circuits. For instance, in other embodiments, the second mixing unit 235 and second capacitor $C_2$ shown in FIG. 2 can be removed, and the differential signal pair composed of the first oscillating signal $S_{LO+}$ and second oscillating signal $S_{LO-}$ can be replaced by a single local oscillating signal, for performing the down-converting operation to output a single-ended output signal. In this example, the impedance at a modified amplifying circuit as seen from the node N' may not match the impedance at a modified down-converting circuit as seen from the node N' adequately, and so the power loss caused by the impedance mismatch may not be reduced. However, with the capacitor $C_1$, the problem resulting from the high noise figure of the conventional mixer is solved as well as the impedance mismatch problem between the conventional mixer and the antenna through the connection of the gate and base of the transistor $Q_1$.

Figure 3:
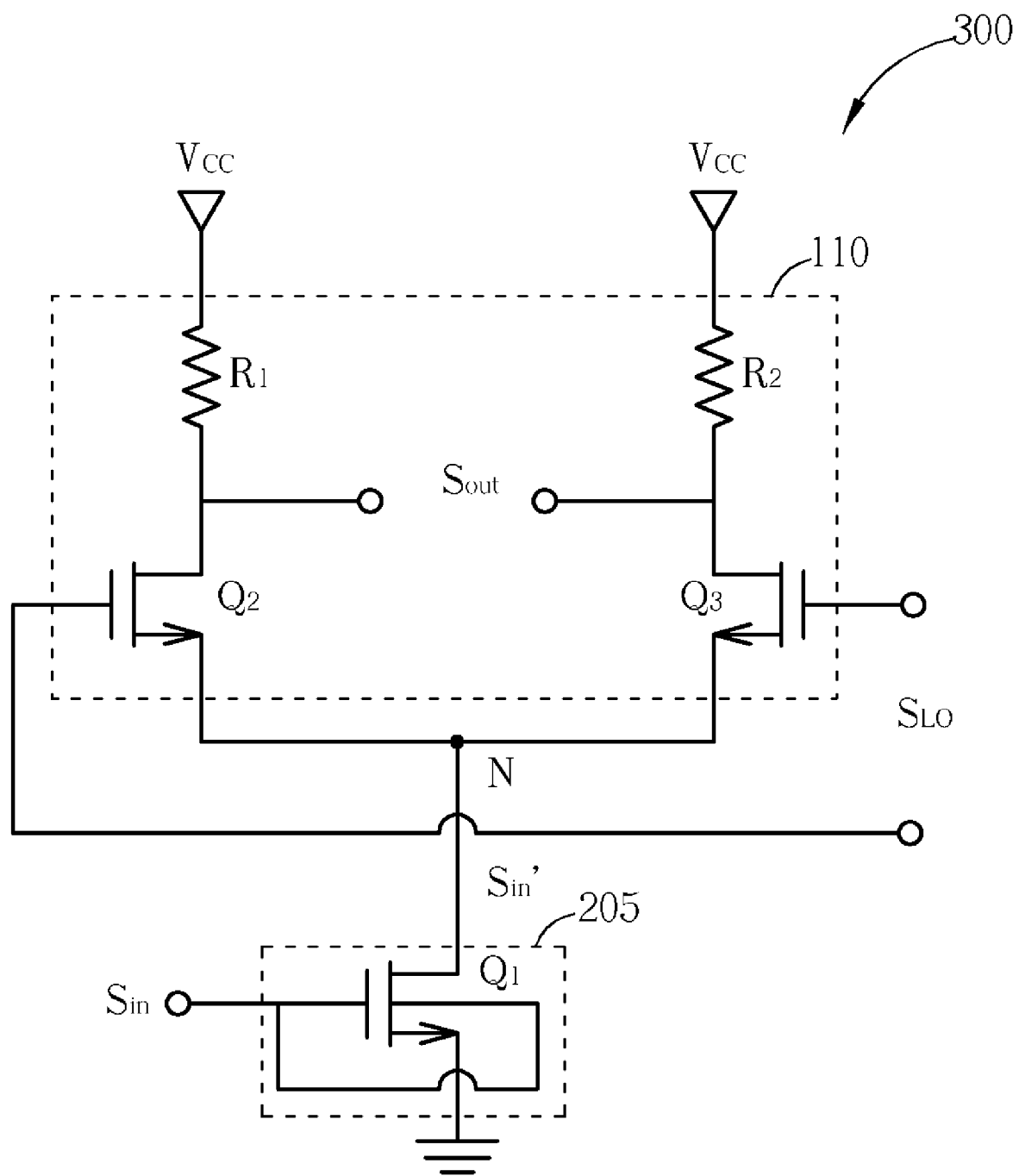
FIG. 3 is a diagram of a mixer according to another embodiment of the present invention.

In another embodiment, a mixer 300 shown in FIG. 3 is constructed by combining the amplifying circuit 205 and the conventional down-converting circuit 110. The noise figure of the mixer 300 may be still high, but almost no impedance mismatch problem between the mixer 300 and the antenna exists through the connection of the gate and base of the transistor $Q_1$. This also falls within the scope of the present invention.

It should be noted that, in each of the above-mentioned embodiments, only one Gilbert cell is used as an illustrative example for brevity. However, one or more of the above-described features disclosed in the present invention can be applied into another mixer composed of more Gilbert cells (e.g. a double balanced mixer composed of a pair of Gilbert cells). Similarly, this solves the problems that the conventional mixers encounter. In addition, the mixers provided by the embodiments of the present invention are located in direct down-conversion receivers or low-IF receivers, but any down-conversion receiver utilizing one of the mixers provided by the present invention also falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mixer for down-converting an input signal into an output signal, comprising:
   an amplifying circuit, for amplifying the input signal to generate an amplified signal; and
   a down-converting circuit, comprising:
      a filtering module, coupled to the amplifying circuit, for filtering out low-frequency components in the amplified signal;
      a loading module, coupled to the amplifying circuit and a predetermined voltage level, for providing a DC bias voltage to the amplifying circuit; and
      a down-converting module, coupled to the filtering module and the predetermined voltage level, for generating the output signal according to a local oscillating signal.

2. The mixer of claim 1, wherein the local oscillating signal comprises a first oscillating signal and a second oscillating signal; the output signal comprises a first output signal and a second output signal; and the filtering module comprises:
   a first capacitor, coupled to the amplifying circuit and the down-converting module, for filtering out low-frequency components in the amplified signal to generate a first filtered signal; and
   a second capacitor, coupled to the amplifying circuit and the down-converting module, for filtering out low-frequency components in the amplified signal to generate a second filtered signal; and
the down-converting module comprises:
   a first mixing unit, coupled to the predetermined voltage level and the first capacitor, for down-converting the first filtered signal to generate the first output signal according to the first oscillating signal; and
   a second mixing unit, coupled to the predetermined voltage level and the second capacitor, for down-converting the second filtered signal to generate the second output signal according to the second oscillating signal.

3. The mixer of claim 2, wherein the first and second oscillating signals are a differential signal pair, and the first and second output signals are another differential signal pair.

4. The mixer of claim 2, wherein the first mixing unit comprises:
   a first transistor having a control end coupled to the first oscillating signal, a first end coupled to the predetermined voltage level, and a second end coupled to the first capacitor; and
the second mixing unit comprises:
   a second transistor having a control end coupled to the second oscillating signal, a first end coupled to the predetermined voltage level, and a second end coupled to the second capacitor.

5. The mixer of claim 4, wherein the amplifying circuit comprises:
   a third transistor having a control end coupled to the input signal, a first end coupled to the loading module, and a second end coupled to another predetermined voltage level;
   wherein the control end of the third transistor is further coupled to a base of the third transistor.

6. The mixer of claim 1, wherein the loading module comprises at least a passive element.

7. The mixer of claim 1, wherein the loading module comprises at least an active element.

8. The mixer of claim 1, wherein the amplifying circuit comprises:

a transistor having a control end coupled to the input signal, a first end coupled to the loading module, and a second end coupled to another predetermined voltage level;

wherein the control end of the transistor is further coupled to a base of the transistor.

9. The mixer of claim 1, being located in a direct down-conversion receiver.

10. The mixer of claim 1, being located in a low-IF receiver or a zero-IF receiver.

11. A mixer for down-converting an input signal into an output signal, comprising:

a transistor having a control end coupled to the input signal and a first end coupled to a predetermined voltage level, the control end being further coupled to a base of the transistor, wherein the transistor is utilized for amplifying the input signal to generate an amplified signal; and a down-converting circuit, coupled to a second end of the transistor and another predetermined voltage level, for down-converting the amplified signal to generate the output signal according a local oscillating signal.

12. The mixer of claim 11, being located in a direct down-conversion receiver.

13. The mixer of claim 11, being located in a low-IF receiver.

* * * * *